United States Patent
Zhang et al.

(10) Patent No.: US 12,237,367 B2
(45) Date of Patent: Feb. 25, 2025

(54) SEMICONDUCTOR STRUCTURES AND METHODS FOR FORMING THE SAME

(71) Applicant: CHANGXIN MEMORY TECHNOLOGIES, INC., Hefei (CN)

(72) Inventors: Junchao Zhang, Hefei (CN); Cheng Yeh Hsu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 791 days.

(21) Appl. No.: 17/593,034

(22) PCT Filed: Apr. 12, 2021

(86) PCT No.: PCT/CN2021/086465
§ 371 (c)(1),
(2) Date: Sep. 5, 2021

(87) PCT Pub. No.: WO2021/204291
PCT Pub. Date: Oct. 14, 2021

(65) Prior Publication Data
US 2022/0310782 A1    Sep. 29, 2022

(30) Foreign Application Priority Data
Apr. 10, 2020  (CN) .......................... 202010279732.4

(51) Int. Cl.
*H01L 29/06* (2006.01)
*H01L 21/762* (2006.01)
*H01L 21/8234* (2006.01)

(52) U.S. Cl.
CPC .... *H01L 29/0649* (2013.01); *H01L 21/76224* (2013.01); *H01L 21/823481* (2013.01)

(58) Field of Classification Search
CPC ........... H01L 29/0649; H01L 21/76224; H01L 21/823481; H10B 12/053; H10B 12/34; H10B 12/00; H10B 12/01
See application file for complete search history.

(56) References Cited

U.S. PATENT DOCUMENTS 8,120,099 B2    2/2012  Seo et al.
8,263,460 B2    9/2012  Kim
(Continued)

FOREIGN PATENT DOCUMENTS

CN    101872745 A    10/2010
CN    107946232 A    4/2018
(Continued)

OTHER PUBLICATIONS

Wilson Yeh et al., "Wet Etchant for DRAM Word-line Titanium Nitride Recess with Selectivity to Tungsten," 2019, EKC Technology, DuPont Electronics & Imaging (Year: 2019).*
(Continued)

*Primary Examiner* — Peter Bradford
*Assistant Examiner* — Ryan T. Fortin
(74) *Attorney, Agent, or Firm* — Syncoda LLC; Feng Ma

(57) ABSTRACT

A method for forming a semiconductor structure includes: providing a semiconductor substrate, the surface of the semiconductor substrate having a plurality of active areas and shallow trench isolation areas arranged in a first direction; etching the active areas and the shallow trench isolation areas in a direction perpendicular to the first direction to form first recesses and second recesses; covering the surfaces of the first recesses and the second recesses with an adhesive layer and a metal layer; and secondarily etching the metal layer and the adhesive layer in the direction perpendicular to the first direction to form a contact hole, the depth of the adhesive layer in the contact hole being defined as H2.

8 Claims, 4 Drawing Sheets

(56) References Cited

U.S. PATENT DOCUMENTS

| | | | |
|---|---|---|---|
| 8,921,234 B2 * | 12/2014 | Liu | H01J 37/32357 |
| | | | 438/711 |
| 10,074,654 B1 | 9/2018 | Takesako et al. | |
| 10,361,205 B2 | 7/2019 | Cho et al. | |
| 10,748,905 B2 | 8/2020 | Lee et al. | |
| 10,790,287 B2 * | 9/2020 | Kang | H10B 12/34 |
| 10,854,613 B2 * | 12/2020 | Chang | H10B 12/053 |
| 11,552,082 B2 * | 1/2023 | Kang | H10B 12/488 |
| 2003/0143790 A1 | 7/2003 | Wu | |
| 2011/0024815 A1 * | 2/2011 | Kim | H01L 21/823437 |
| | | | 257/E21.627 |
| 2011/0027988 A1 * | 2/2011 | Hwang | H10B 12/053 |
| | | | 257/E21.159 |
| 2014/0042548 A1 * | 2/2014 | Liu | H10B 12/053 |
| | | | 257/368 |
| 2014/0306277 A1 | 10/2014 | Asao | |
| 2016/0284640 A1 | 9/2016 | Wang et al. | |
| 2018/0294188 A1 * | 10/2018 | Chen | H01L 21/31058 |

FOREIGN PATENT DOCUMENTS

| | | | | |
|---|---|---|---|---|
| CN | 108172620 A | | 6/2018 | |
| CN | 208271893 U | | 12/2018 | |
| CN | 209312720 U | | 8/2019 | |
| EP | 849377 A2 * | | 6/1998 | C23G 5/00 |
| JP | 2011192800 A | | 9/2011 | |
| JP | 2016046414 A | | 4/2016 | |

OTHER PUBLICATIONS

CN first office action in Application No. 202010279732.4, mailed on Mar. 8, 2022.

International Search Report (ISR) in PCT/2021/086465 mailed on Jul. 1, 2021.

* cited by examiner

SEMICONDUCTOR STRUCTURES AND METHODS FOR FORMING THE SAME

CROSS-REFERENCE TO RELATED APPLICATIONS

This application is a national stage of International Application No. PCT/CN2021/086465 filed on Apr. 12, 2021, which claims priority to Chinese Patent Application No. 202010279732.4filed on Apr. 10, 2020. The disclosures of these applications are hereby incorporated by reference in their entirety.

TECHNICAL FIELD

The present application relates to the technical field of semiconductors, and in particular to a semiconductor structure and a method for forming the same.

BACKGROUND

Dynamic random-access memory devices are semiconductor memory devices widely used in multicomputer systems. With the continuous reduction in the feature size of semiconductor integrated circuit devices, the development of dynamic random-access memory devices shows high integration, which makes the semiconductor manufacturing technology more challenging.

In the technical field of semiconductors, due to the design layout of the structure, the buried word lines (WL) will go through both the active areas (AA) and the shallow trench isolation areas (STI). The buried word lines in the shallow trench isolation areas will, when they are working, be coupled with the buried word lines in the parallel active areas. As a result, there is an extra strong electric field between the gate in the active area and the semiconductor substrate, which is affected by the gate induced drain leakage (GIDL). Therefore, how to effectively reduce the gate induced drain leakage and improve the refresh performance is a technical problem to be solved urgently.

SUMMARY

The purpose of the present application is to provide a semiconductor structure and a method for forming the same, which can improve the gate induced drain leakage effect and improve the refresh performance.

In order to solve the above technical problem, the present application provides a method for forming a semiconductor structure, comprising:

providing a semiconductor substrate, a surface of the semiconductor substrate having a plurality of active areas and shallow trench isolation areas arranged in a first direction;

etching the active areas and the shallow trench isolation areas in a direction perpendicular to the first direction to form first recesses and second recesses;

covering surfaces of first recesses and second recesses with an adhesive layer and a metal layer; and secondarily etching the metal layer and the adhesive layer in the direction perpendicular to the first direction to form contact holes, depths of the adhesive layer in contact holes being defined as H2.

Optionally, before the etching the active areas and the shallow trench isolation areas to form first recesses and second recesses, a sacrificial layer is deposited on the surface of the semiconductor substrate.

Optionally, the metal layer deposited on the surface of the recesses is removed by a chemical mechanical polishing process to form recesses from which the adhesive layer is exposed.

Optionally, before the secondary etching, the method further comprises: pre-etching the adhesive layer exposed from second recesses in shallow trench isolation areas in the direction perpendicular to the first direction, the depth of pre-etching the adhesive layer being defined as H0, the H0 being less than the H2.

Optionally, the secondarily etching the metal layer and the adhesive layer further comprises: continuously etching the adhesive layer and the metal layer to form contact holes in the direction perpendicular to the first direction, the depth of etching the adhesive layer and the metal layer being defined as H1, the H1 being less than the H2.

Optionally, the range of the H0 is from 10 nanometers to 20 nanometers; the range of the H1 is from 60 nanometers to 70 nanometers; and the range of the H2 is from 71 nanometers to 80 nanometers.

Optionally, the adhesive layer is made of titanium nitride and the metal layer is made of tungsten.

Optionally, the sacrificial layer is made of at least one of silicon dioxide, silicon nitride, silicon oxynitride, polycrystalline silicon, monocrystalline silicon, and carbon.

The technical solution of the present application further provides a semiconductor structure, comprising:

a semiconductor substrate, a surface of the semiconductor substrate having a plurality of active areas and shallow trench isolation areas arranged in a first direction;

first recesses, located in active areas and are perpendicular to the first direction;

second recesses, located in shallow trench isolation areas and are perpendicular to the first direction;

an adhesive layer and a metal layer, covered on surfaces of first recesses and second recesses; and contact holes, formed based on the method for forming the semiconductor structure.

Optionally, the depth of contact holes are defined as H2; wherein contact holes are formed by secondary etching and the range of the H2 is from 71 nanometers to 80 nanometers.

Compared with the semiconductor manufacturing technologies, the present application has the following advantages. First, in the present application, since contact holes with a certain depth are formed at the position of the buried word lines in the shallow trench isolation areas by secondary etching, the gate-side effective distance between the buried word lines adjacent to the active areas becomes larger, so that the additional electric fields between the adjacent buried word lines are weakened. Thus, the gate induced drain leakage effect is improved and the refresh performance is further improved. Second, in the present application, compared with the technical solution in which a gap is introduced between the gate and the drain or high-resistance substance is filled between the gate and the drain, the masking and etching process used in this technical solution is less technically difficult and is easier for implementation. Third, in the present application, the resistance of the buried word lines is still maintained low. Therefore, the present application can improve the gate induced drain leakage effect and further improve the refresh performance.

Figure 1:
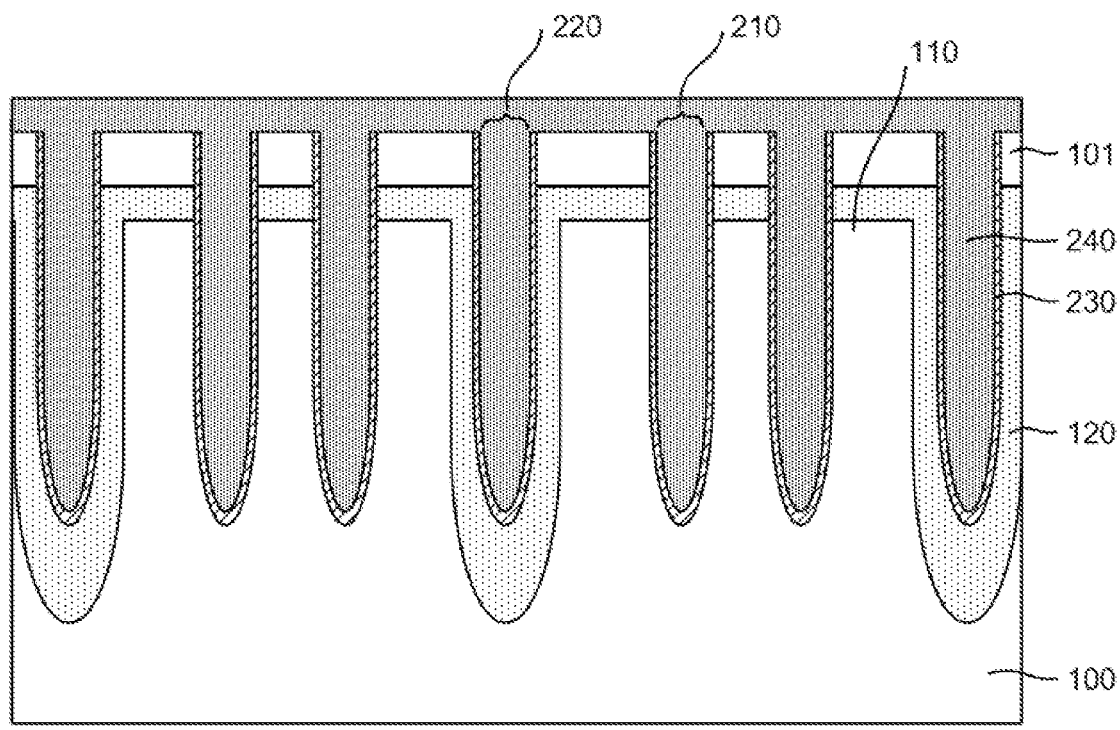
FIG. 1 is a first schematic structure diagram of a step of the method for forming a semiconductor structure, according to an embodiment of the present application.

Reference numerals:

A-A1: first direction; 100: semiconductor substrate; 110: active area; 120: shallow trench isolation area; 101: sacrificial layer; 210: first recesses; 220: second recesses; 300: contact holes; H2: depth; 230: adhesive layer; 240: metal layer.

DETAILED DESCRIPTION

In order to explain technical solutions of embodiments of the present application more clearly, the accompanying drawings to be used for describing the embodiments of the present application will be introduced simply. Apparently, the accompanying drawings to be described below are merely some embodiments of the present application. A person of ordinary skill in the art may obtain other drawings according to these drawings without paying any creative effort.

Figure 2:
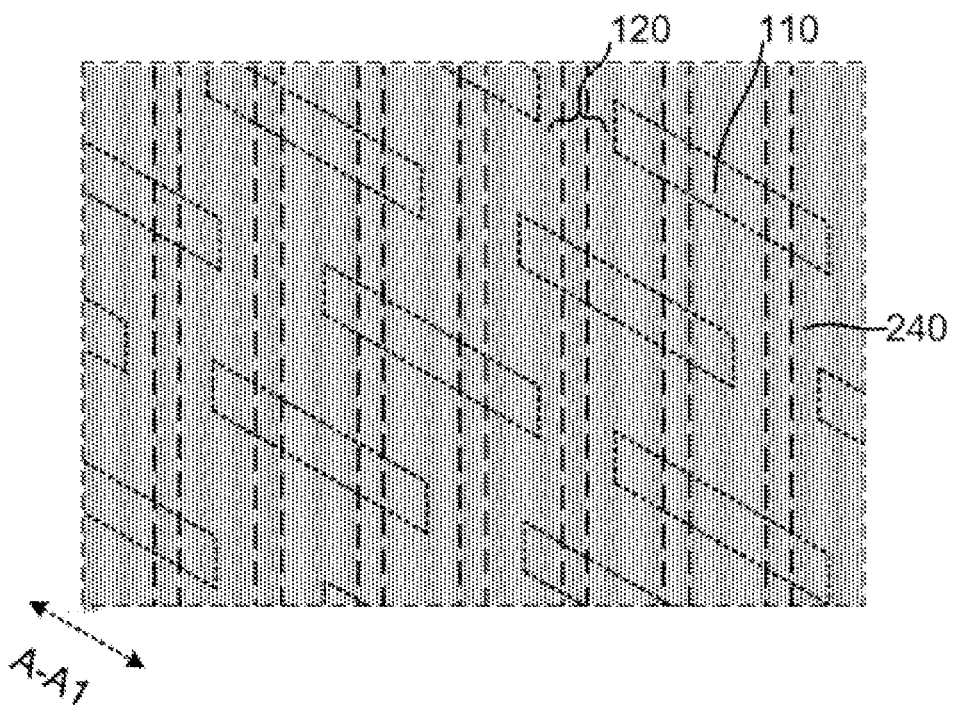
FIG. 2 is a first top plan view of a step of the method for forming a semiconductor structure, according to an embodiment of the present application.

FIG. 1 is a schematic structure diagram of the method for forming a semiconductor structure in this embodiment. FIG. 2 is a top plan view of the method for forming a semiconductor structure in this embodiment.

A semiconductor substrate 100 is provided. The surface of the semiconductor substrate has a plurality of active areas 110 and shallow trench isolation areas 120, defined as a plurality of shallow trench isolation areas 120 arranged in the first direction A-A1 and a plurality of active areas 110 extending in the first direction A-A1.

The semiconductor substrate 100 may comprise, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may be an intrinsic silicon substrate or a doped silicon substrate, and further, it may be an N-type polycrystalline silicon substrate or a P-type polycrystalline silicon substrate.

A sacrificial layer 101 is deposited on the surface of the semiconductor substrate 100. The sacrificial layer 101 is made of at least one of silicon dioxide, silicon nitride, silicon oxynitride, polycrystalline silicon, monocrystalline silicon, and carbon. In this embodiment, a silicon nitride layer is deposited on the surface of the semiconductor substrate 100 to cover the active areas 110 and the shallow trench isolation areas 120. The deposition of a silicon nitride layer is to prepare a mask layer for subsequent etching. The mask layer (not shown) comprises: a silicon nitride layer with a thickness of 45 nanometers; a carbon layer with a thickness of 150 nanometers; and a DARC layer with a thickness of 30 nanometers (silicon oxynitride).

The active areas 110 and the shallow trench isolation areas 120 are etched in a direction perpendicular to the first direction A-A1 to form first recesses 210 and second recesses 220. The surfaces of the first recesses 210 and the second recesses 220 are covered with an adhesive layer 230 and a metal layer 240. The adhesive layer 230 is made of titanium nitride and the metal layer 240 is made of tungsten.

An adhesive layer 230 and a metal layer 240 are sequentially deposited on the surfaces of the first recesses 210 and the second recesses 220 by a deposition process. In the thin film deposition process, there are two main deposition methods: chemical vapor deposition, in which gases of one or more substances are activated somehow to have chemical reactions on the surface of the substrate and then deposited into a desired solid thin film. Physical vapor deposition may be used, in which the transfer of substances is realized by a certain physical process, that is, atoms or molecules are transferred to the surface of the silicon substrate and deposited into a thin film. The thin film deposition process further includes pin coating, electroplating and the like. For example, in this embodiment, there may be many specific deposition methods for the adhesive layer 230. For example, chemical vapor deposition may be used to deposit an adhesive layer 230 with a preset thickness distribution in the first recesses 210. Further, controlling the flow rate of the introduced airflow, controlling the flow of the introduced airflow, controlling the deposition time, or controlling the deposition temperature may be used separately. By improving the accuracy in controlling the airflow and temperature, all atoms can be deposited neatly to form a single crystalline layer. Finally, an adhesive layer 230 with a uniform thickness is obtained in the first recesses 210 and the second recesses 220. Further, the metal layer 240 is filled to cover the first recesses 210 and the second recesses 220.

It may be understood by those skilled in the art that, in the technical field of semiconductors, due to the design layout of the structure, the buried word lines (WL) will go through both the active areas (AA) and the shallow trench isolation areas (STI). The buried word lines in the shallow trench isolation areas will, when they are working, be coupled with the buried word lines in the parallel active areas. As a result, there is an extra strong electric field between the gate in the active area and the semiconductor substrate, which is affected by the gate induced drain leakage (GIDL). Therefore, there is a need for a buried gate preparation method that improves the gate induced drain leakage effect.

Figure 3:
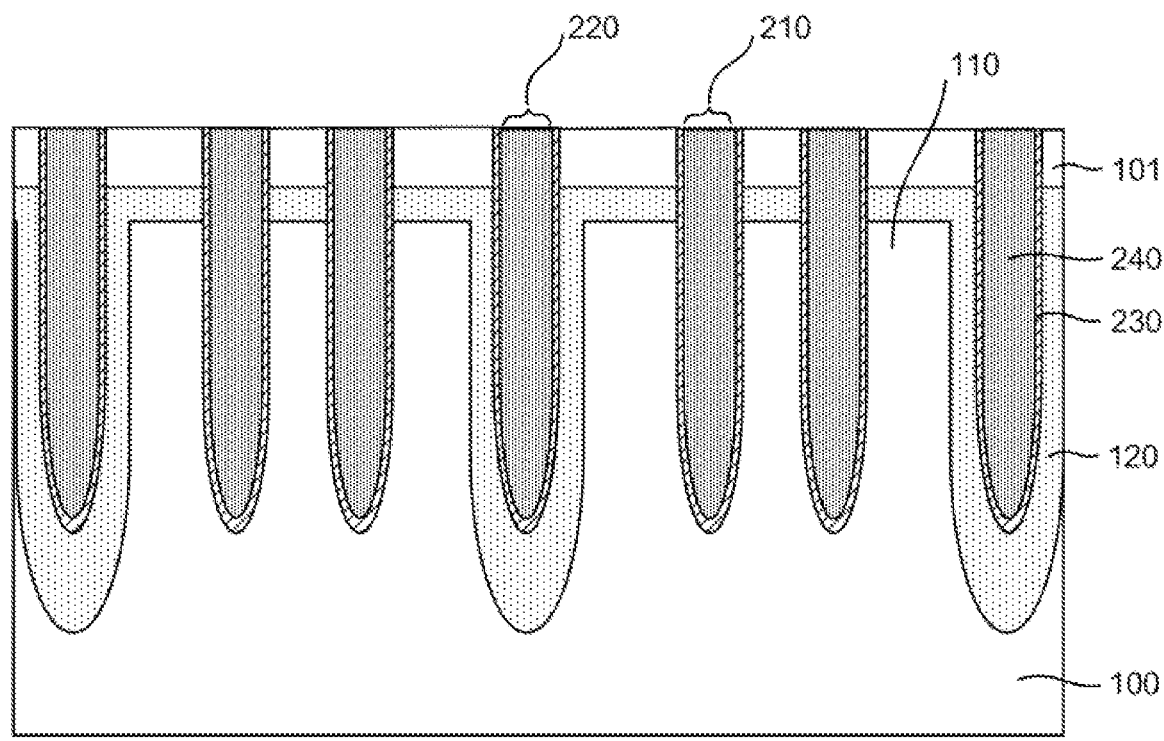
FIG. 3 is a second schematic structure diagram of a step of the method for forming a semiconductor structure, according to an embodiment of the present application.
Figure 4:
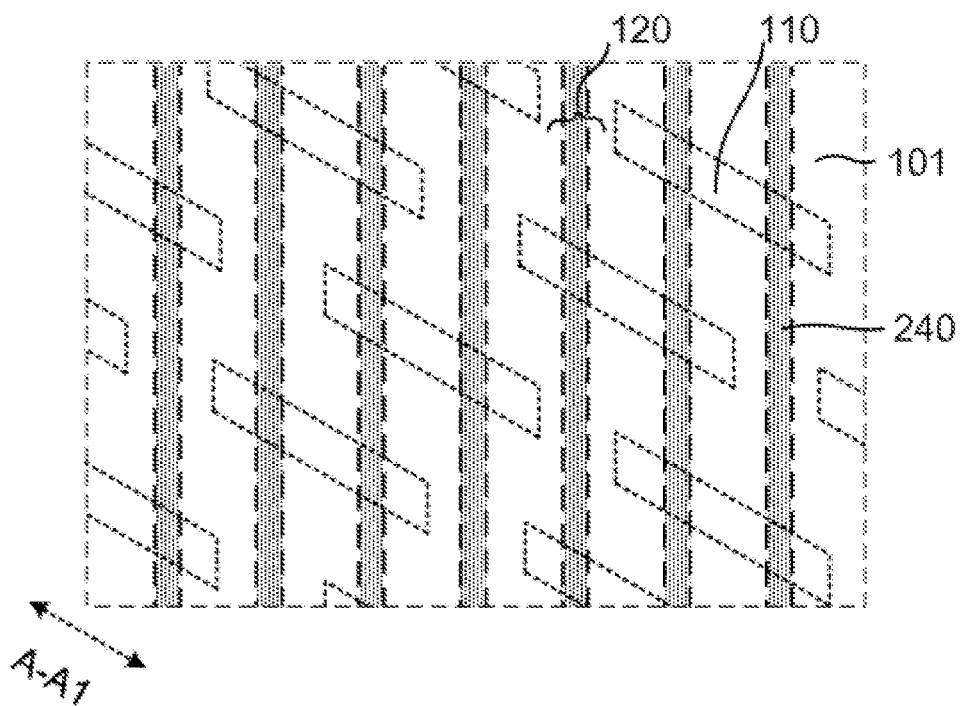
FIG. 4 is a second top plan view of a step of the method for forming a semiconductor structure, according to an embodiment of the present application.

FIG. 3 is a schematic structure diagram of the method for forming a semiconductor structure in this embodiment. FIG. 4 is a top plan view of the method for forming a semiconductor structure in this embodiment.

The metal layer 240 deposited on the surface of the recesses is removed by a chemical mechanical polishing process to form a recess from which the adhesive layer 230 is exposed.

In this embodiment, due to the deposition in the active areas 110 and the shallow trench isolation areas 120 in the above steps, the outermost layer is the metal layer 240. It is required to remove the excess metal layer 240 by a chemical mechanical polishing process to expose the adhesive layer 230, in order to facilitate the subsequent etching process.

Figure 5:
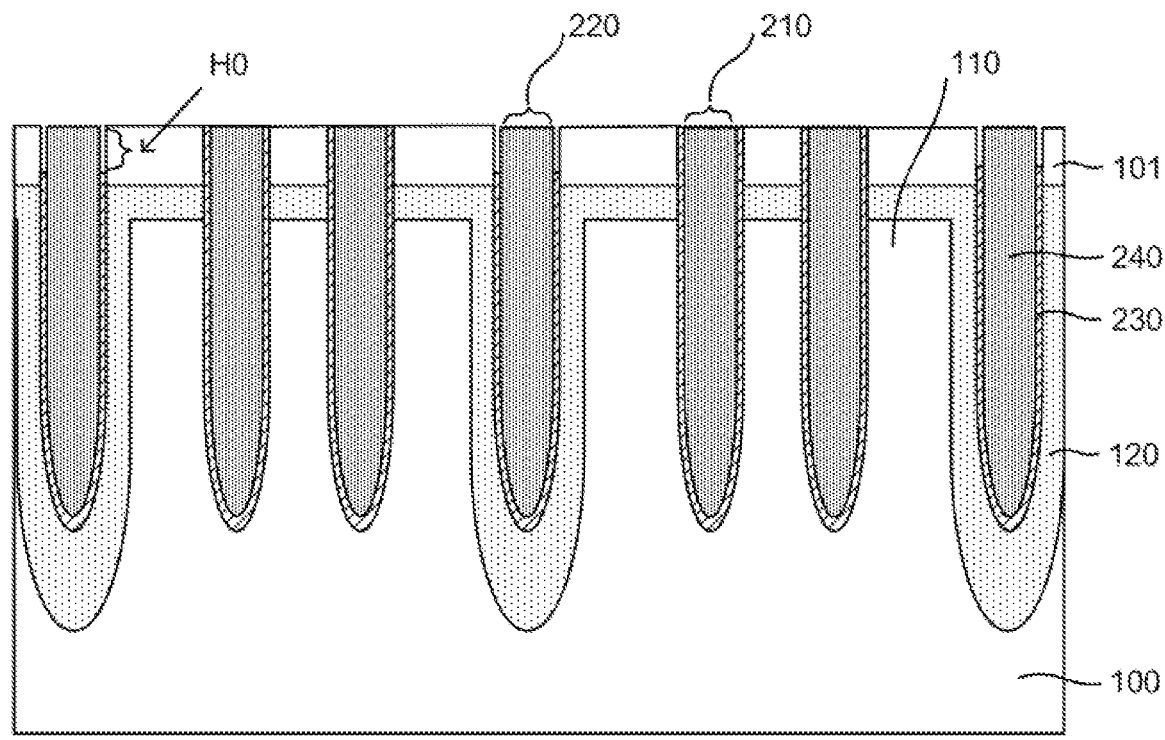
FIG. 5 is a third schematic structure diagram of a step of the method for forming a semiconductor structure, according to an embodiment of the present application.
Figure 6:
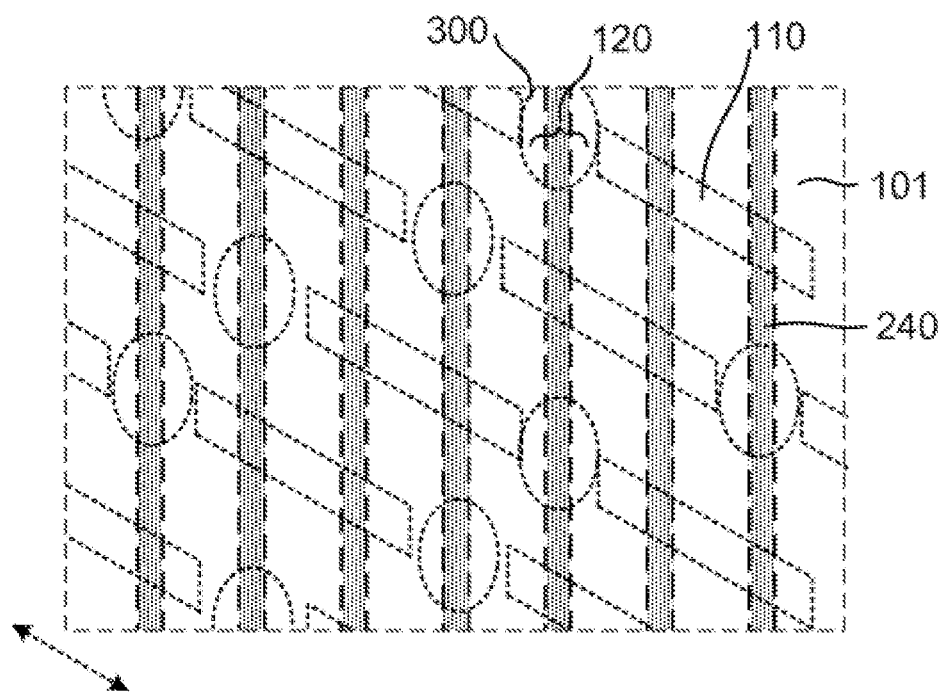
FIG. 6 is a third top plan view of a step of the method for forming a semiconductor structure, according to an embodiment of the present application.

FIG. 5 is a schematic structure diagram of the method for forming a semiconductor structure in this embodiment. FIG.

6 is a top plan view of the method for forming a semiconductor structure in this embodiment.

The adhesive layer 230 exposed from the second recesses 220 in the shallow trench isolation area 120 is etched in the direction perpendicular to the first direction A-A1, the depth of etching the adhesive layer 230 is defined as H0, and the range of the H0 is from 10 nanometers to 20 nanometers. Meanwhile, the H0 is less than the H2. The H2 is the depth of the contact holes 300 in the second recesses 220 finally formed in this embodiment, and the range of the H2 is from 71 nanometers to 80 nanometers.

By an etching process, the adhesive layer 230 exposed from the second recesses 220 in the shallow trench isolation area 120 is etched downward by using the depth of H0 as the standard. In this embodiment, the adhesive layer 230 may be etched by dry etching. The semiconductor structure is conveyed to the reaction chamber, and the pressure in the reaction chamber is decreased by a vacuum system. When the reaction chamber is in vacuum, a reaction gas is introduced into the reaction chamber. For the etching of a titanium nitride material, a mixture of nitrogen fluoride and oxygen is usually used as the reaction gas. Alternatively, other fluorine-containing gases may be used as the etching gas, for example carbon tetrafluoride, sulfur hexafluoride, nitrogen trifluoride, silicon tetrachloride, chlorine, and the like. The power supply creates a radio frequency electric field through the electrodes in the reaction chamber. The energy field excites the mixed gas into the plasma state. In the excited state, the etching is performed with the reactive fluorine and the reactive fluorine is converted into volatile components to be discharged by the vacuum system. In this embodiment, the main component of the reaction gas used is nitrogen fluoride. By controlling the ratio of nitrogen ions to fluoride ions, at the same time, controlling the reaction time, temperature and other factors of the process, the etching rate is adjusted.

In this embodiment, in the first step, only the adhesive layer 230 exposed from the second recesses 220 in the shallow trench isolation area 120 is selectively etched, in order to distinguish the depth of the adhesive layer 230 exposed from the first recesses 210 in the active area 110 during the secondary etching in the subsequent process.

Figure 7:
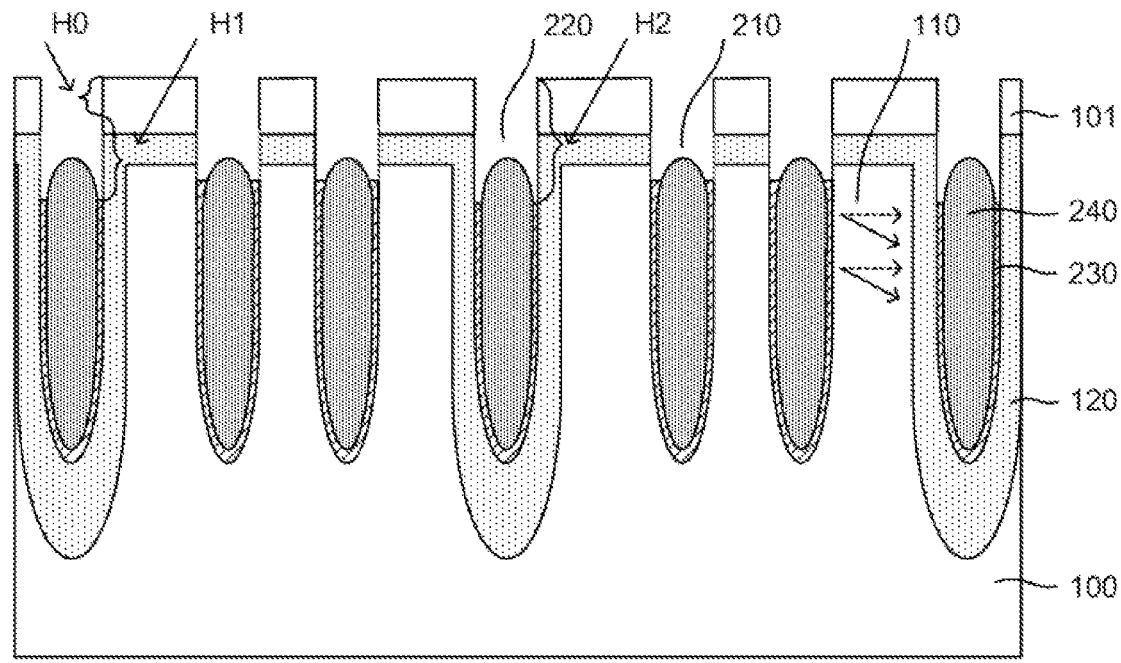
FIG. 7 is a fourth schematic structure diagram of a step of the method for forming a semiconductor structure, according to an embodiment of the present application.
Figure 8:
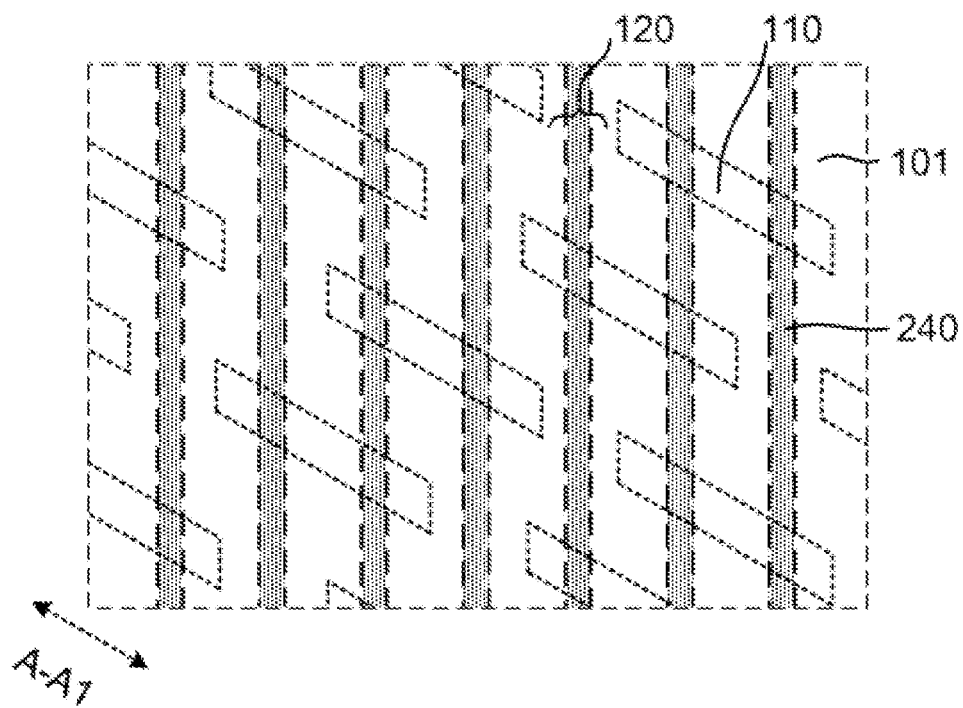
FIG. 8 is a fourth top plan view of a step of the method for forming a semiconductor structure, according to an embodiment of the present application.

FIG. 7 is a schematic structure diagram of the method for forming a semiconductor structure in this embodiment. FIG. 8 is a top plan view of the method for forming a semiconductor structure in this embodiment.

The active area 110 and the shallow trench isolation area 120 are continuously etched in the direction perpendicular to the first direction, to expose the adhesive layer and the metal layer to form contact holes. The depth of etching the adhesive layer and the metal layer is defined as H1, and the H1 is less than the H2. Further, the range of the H0 is from 10 nanometers to 20 nanometers; the range of the H1 is from 60 nanometers to 70 nanometers; the range of the H2 is from 71 nanometers to 80 nanometers; and the H2=the H1+the H0.

In this embodiment, the adhesive layer 230 and the metal layer 240 are continuously etched downward to a certain depth by plasma dry etching. Dry etching is a process that uses plasma to etch the thin film. When the gas exists in the form of plasma, it has two characteristics: on one hand, the chemical activities of the gas in the form of plasma are much stronger than in the normal state. Depending upon different materials to be etched, the selection of an appropriate gas may facilitate the reaction with the materials to achieve the purpose of etching and removal; and on the other hand, the plasma may be guided and accelerated by the electric field to have certain energy, and when the surface of the material to be etched is bombarded by the plasma, the plasma will knock out atoms of the material to be etched, thus to realize physical energy transfer to achieve the purpose of etching. Therefore, dry etching is the result of balancing physical and chemical processes on the surface of the wafer. In this embodiment, the use of plasma dry etching realizes more precise processing, and the resistance of the buried word lines will not increase due to the too large etching depth. Meanwhile, the masking and etching process used in the technical solution are less technically difficult and easier to obtain the desired design shape.

Further, the range of the H0 is from 10 nanometers to 20 nanometers; the range of the H1 is from 60 nanometers to 70 nanometers; the range of the H2 is from 71 nanometers to 80 nanometers. For example, the H2 may be equal to the sum of the H1 and the H0. In this way, the height of the adhesive layer 230 in the shallow trench isolation area 220 is much lower than the height of the adhesive layer 230 in the active area 210.

Compared with some semiconductor manufacturing technologies, in the present application, by pre-etching, the adhesive layer of the buried word lines is formed in the shallow trench isolation area to a certain depth, which can improve the coupling path of the buried word lines in the adjacent active areas to the shallow trench isolation areas. It may be found from the arrow in FIG. 7 that, substituted solid arrows for dash arrows the path becomes longer, so the gate-side effective distance between the buried word lines adjacent to the active areas becomes larger. Therefore, the additional electric fields between the adjacent buried word lines in the shallow trench isolation areas and the adjacent buried word lines in the active areas are weakened. Thus, the gate induced drain leakage effect is improved. Meanwhile, in the present application, compared with the technical solution in which a gap is introduced between the gate and the drain and high-resistance substance is filled between the gate and the drain, the masking and etching process used in this technical solution are less technically difficult and easier for implementation.

Further, the metal layer 240 is higher than the adhesive layer 230. Therefore, in the present application, the resistance of the buried word lines is still maintained low. Therefore, the present application can improve the gate induced drain leakage effect and further improve the refresh performance.

An embodiment of the present application further provides a semiconductor structure.

FIG. 7 is a schematic cross-sectional view of a semiconductor structure in an embodiment of the present application.

The semiconductor structure comprises: a semiconductor substrate 100, active areas 110, shallow trench isolation areas 120, first recesses 210, second recesses 220, an adhesive layer 230, a metal layer 240, contact holes 300, and a sacrificial layer 101.

The surface of the semiconductor substrate has a plurality of active areas 110 and shallow trench isolation areas 120, defined as a plurality of shallow trench isolation areas 120 arranged in the first direction A-A1 and a plurality of active areas 110 extending in the first direction A-A1.

The semiconductor substrate 100 may comprise, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may be an intrinsic silicon substrate or a doped silicon substrate, and further, it may be an N-type polycrystalline silicon substrate or a P-type polycrystalline silicon substrate.

Further, the sacrificial layer 101 covers the surface of the semiconductor substrate 100. The sacrificial layer 101 is made of at least one of silicon dioxide, silicon nitride, silicon oxynitride, polycrystalline silicon, monocrystalline silicon, and carbon. In this embodiment, a silicon nitride layer is deposited on the surface of the semiconductor substrate 100 to cover the active areas 110 and the shallow trench isolation areas 120. The deposition of a silicon nitride layer is to prepare a mask layer for subsequent etching.

The active areas 110 and the shallow trench isolation areas 120 are etched in a direction perpendicular to the first direction A-A1 to form first recesses 210 and second recesses 220. The surfaces of the first recesses 210 and the second recesses 220 are covered with an adhesive layer 230 and a metal layer 240. The adhesive layer 230 is made of titanium nitride and the metal layer 240 is made of tungsten.

The contact holes 300 are formed based on the method for forming a semiconductor structure. Further, the depth of the adhesive layer 230 in the contact holes 300 in the second recesses 220 are defined as H2; wherein the H2 is formed by secondary etching and the range of the H2 is from 71 nanometers to 80nanometers.

Compared with some semiconductor manufacturing technologies, in the present application, by pre-etching, the adhesive layer of the buried word lines is formed in the shallow trench isolation area to a certain depth, which can improve the coupling path of the buried word lines in the adjacent active areas to the shallow trench isolation areas. It may be found from the arrow in FIG. 7 that, the path becomes longer, so the gate-side effective distance between the buried word lines adjacent to the active areas becomes larger. Therefore, the additional electric fields between the adjacent buried word lines in the shallow trench isolation areas and the adjacent buried word lines in the active areas are weakened. Thus, the gate induced drain leakage effect is improved. Meanwhile, in the present application, compared with the technical solution in which a gap is introduced between the gate and the drain and high-resistance substance is filled between the gate and the drain, the masking and etching process used in this technical solution is less technically difficult and is easier for implementation.

The foregoing descriptions are merely preferred embodiments of the present application. It should be noted that, for a person of ordinary skill in the art, various improvements and modifications may be made without departing from the principle of the present application, and these improvements and modifications shall be deemed as falling into the protection scope of the present application.

What is claimed is:

1. A method for forming a semiconductor structure, comprising:
    providing a semiconductor substrate, a surface of the semiconductor substrate having a plurality of active areas and shallow trench isolation areas arranged in a first direction;
    etching the active areas and the shallow trench isolation areas in a direction perpendicular to the first direction to form first recesses and second recesses;
    covering surfaces of the first recesses and the second recesses with an adhesive layer and a metal layer;
    removing the metal layer covering the surfaces of the first recesses and the second recesses by a chemical mechanical polishing process to form recesses from which the adhesive layer is exposed;
    pre-etching selectively the adhesive layer exposed from second recesses in the shallow trench isolation areas in the direction perpendicular to the first direction, a depth of the pre-etching the adhesive layer being defined as H0; and
    secondarily etching the metal layer and the adhesive layer in the direction perpendicular to the first direction to form contact holes, depths of the adhesive layer in the contact holes being defined as H2, the H0 being less than the H2;
    wherein an upper surface of the adhesive layer in the contact holes is deeper than an upper surface of the adhesive layer in the first recesses.

2. The method for forming a semiconductor structure according to claim 1, prior to the etching the active areas and the shallow trench isolation areas to form the first recesses and the second recesses, the method further comprising:
    depositing a sacrificial layer on the surface of the semiconductor substrate.

3. The method for forming a semiconductor structure according to claim 2, wherein
    the sacrificial layer is made of at least one of silicon dioxide, silicon nitride, silicon oxynitride, polycrystalline silicon, monocrystalline silicon, or carbon.

4. The method for forming a semiconductor structure according to claim 1, wherein
    a range of the H0 is from 10 nanometers to 20 nanometers.

5. The method for forming a semiconductor structure according to claim 1, the secondarily etching the metal layer and the adhesive layer further comprising:
    continuously etching the adhesive layer and the metal layer to form contact holes in the-direction perpendicular to the first direction, a depth of the secondarily etching the adhesive layer and the metal layer being defined as H1, the H1 being less than the H2.

6. The method for forming a semiconductor structure according to claim 5, wherein
    a range of the H1 is from 60 nanometers to 70 nanometers.

7. The method for forming a semiconductor structure according to claim 1, wherein
    a range of the H2 is from 71 nanometers to 80 nanometers.

8. The method for forming a semiconductor structure according to claim 1, wherein
    the adhesive layer is made of titanium nitride, and the metal layer is made of tungsten.

* * * * *